United States Patent [19]

Vora et al.

[11] 4,374,011

[45] Feb. 15, 1983

[54] PROCESS FOR FABRICATING NON-ENCROACHING PLANAR INSULATING REGIONS IN INTEGRATED CIRCUIT STRUCTURES

[75] Inventors: Madhukar B. Vora, Los Gatos; Werner F. Rust, Mountain View, both of Calif.

[73] Assignee: Fairchild Camera & Instrument Corp., Mountain View, Calif.

[21] Appl. No.: 261,843

[22] Filed: May 8, 1981

[51] Int. Cl.$^3$ .............................................. H01L 27/04
[52] U.S. Cl. ........................ 204/192 EC; 204/192 E
[58] Field of Search ..................... 204/192 E, 192 EC

[56] References Cited

U.S. PATENT DOCUMENTS

| | | | |
|---|---|---|---|
| 3,117,260 | 1/1964 | Noyce | 317/235 |
| 3,391,023 | 7/1968 | Frescura | 117/212 |
| 3,489,961 | 1/1970 | Frescura et al. | 317/235 |
| 3,648,125 | 3/1972 | Peltzer | 317/956 |
| 3,940,506 | 2/1976 | Hewecke | 204/192 EC |
| 3,962,717 | 6/1976 | O'Brien | 357/44 |
| 3,993,513 | 11/1976 | O'Brien | 148/175 |
| 4,104,086 | 8/1978 | Bondue | 148/1.5 |
| 4,111,720 | 9/1978 | Michel et al. | 148/1.5 |
| 4,168,999 | 9/1979 | Vora et al. | 148/175 |
| 4,307,180 | 12/1981 | Pogge | 430/314 |

OTHER PUBLICATIONS

Kennedy, J. Vac. Sci. Tech., 13, (1976), pp. 1135–1137.
Logan et al., IBM Tech. Disc. Bull., 21, (1979), pp. 4865–4866.
Logan et al., IBM J. Res. Develop., Mar. 1970, pp. 182–191.

Primary Examiner—Arthur P. Demers
Attorney, Agent, or Firm—Kenneth Olsen; Theodore S. Park; Warren M. Becker

[57] ABSTRACT

A method for fabricating insulating regions in an integrated circuit structure is disclosed in which the insulating regions do not encroach upon the surrounding integrated circuit and in which a substantially planar surface across the top of the insulating material and the substrate is created. The method includes the steps of removing portions of the substrate wherever the insulating regions are to be formed, beginning to deposit insulating material across the substrate and in the openings created, and, while continuing to deposit insulating material simultaneously removing insulating material from generally horizontal surfaces and redepositing it on generally vertical surfaces of the substrate and the openings until a planar surface results.

14 Claims, 9 Drawing Figures

PROCESS FOR FABRICATING NON-ENCROACHING PLANAR INSULATING REGIONS IN INTEGRATED CIRCUIT STRUCTURES

BACKGROUND OF THE INVENTION

1. Field of the Invention

This invention relates to integrated circuit structures, and in particular to a process for fabricating insulating regions of oxidized semiconductor material in such structures in which the insulating regions do not encroach into the surrounding semiconductor material and which insulating regions have an upper surface planar with respect to the semiconductor substrate.

2. Description of the Prior Art

In the fabrication of integrated circuits, large numbers of active and/or passive electronic components are formed in a single substrate of semiconductor material, typically monocrystalline silicon. For the proper functioning of individual components or groups of components, these components or groups must be electrically isolated from each other. This electrical isolation prevents currents or voltages which are induced in one part of the circuit from being communicated to another part of the circuit where they are not desired.

Numerous techniques are known for providing such electrical isolation in an integrated circuit structure. Among known techniques are pn junctions (U.S. Pat. No. 3,117,260 to Noyce), dielectric isolation (U.S. Pat. No. 3,391,023 to Frescura), mesa etching (U.S. Pat. No. 3,489,961 to Frescura), and oxide isolation (U.S. Pat. 3,648,125 to Peltzer). Oxide isolation refers to the technique by which selected regions of semiconductor material in the integrated circuit are oxidized and thereby converted from being semiconducting material to electrically insulating material.

One known technique for fabricating oxide isolation regions in semiconductor structures is disclosed in U.S. Pat. No. 3,648,125 issued to Douglas Peltzer and entitled: "Method of Fabricating Integrated Circuits with Oxidized Isolation and the Resulting Structure." The Peltzer patent teaches formation of oxidized regions of semiconductor material, typically silicon dioxide, by etching annular grooves in the surface of the integrated circuit which will surround subsequently formed components. These grooves are then oxidized to create regions of oxidized semiconductor material which extend vertically into the integrated circuit structure to contact a laterally extending pn junction. Thus all electronic components above the pn junction and within the annular ring of oxidized semiconductor material will be electrically isolated from surrounding components. Because the pn junction is usually created by epitaxially depositing silicon over a substrate, the region of silicon above the isolating pn junction and surrounded by the oxidized material is termed an "epitaxial pocket."

Unfortunately, most conventional techniques of fabricating oxide isolation, although widely used in the semiconductor industry, suffer from a disadvantage known as the "bird's beak" or "encroachment." For example, U.S. Pat. No. 4,168,999 teaches one technique for minimizing, but not eliminating, encroachment. Encroachment is illustrated in FIGS. 1 and 2 herein and is discussed below. Briefly, because oxidization of semiconductor material is an isotropic process, regions of oxidized semiconductor material formed in depressions in an otherwise flat surface will slope into the adjoining regions of semiconductor material. This phenomenon is known as encroachment or the "bird's beak" effect. Encroachment is undesirable because it uses additional amounts of the surface of the integrated circuit structure. Further, because of the encroachment of the insulating regions into the non-insulating regions, a parasitic region of semiconductor material is created beneath the "bird's beak." This parasitic region stores electrical charge when underlying layers are electrically biased. The parasitic region slows the operation of electronic components fabricated within the epitaxial silicon pocket. Additionally, oxidized semiconductor material formed using conventional techniques protrudes upwards from the surface of the surrounding material. This upward projection of the oxide isolation regions makes subsequent formation of conducting or insulating layers across the surface of the integrated circuit structure difficult. Such subsequently formed layers have a propensity to crack where they cross the upward projections.

One technique for eliminating encroachment in an oxide isolated integrated circuit structure is mentioned in U.S. Pat. No. 4,111,720 entitled "Method of Forming a Non-Epitaxial Bipolar Integrated Circuit," and issued to Michel et al. That patent discloses that recessed regions of silicon dioxide may be formed by sputter etching the substrate then depositing silicon dioxide. Unfortunately, this technique also suffers from a disadvantage in that it is difficult to create a planar upper surface when depositing silicon dioxide. The disadvantages of non-planar surfaces are well-known and include the difficulty of forming electrical connections traversing the surface.

SUMMARY OF THE INVENTION

This invention provides a process for fabricating insulating regions in an integrated circuit structure which insulating regions have a planar surface with respect to the upper surface of the integrated circuit structure, and which insulating regions do not encroach upon the semiconductor material being electrically isolated from surrounding regions. In one embodiment a method for fabricating insulating regions in an integrated circuit structure having a substrate comprises: removing a first portion of the substrate to create an opening wherein the insulating region is to be formed, beginning to deposit insulating material across the substrate and in the opening, continuing to deposit insulating material, while simultaneously removing insulating material from generally horizontal surfaces and redepositing it on generally vertical surfaces until the opening has been filled to create a substantially planar layer of insulating material on the substrate.

Typically the step of removing a first portion of the substrate is performed by an anisotropic etching process, for example, plasma etching. Such an etching procedure may be accomplished by first forming a layer of plasma etch resistant material on a surface of the integrated circuit structure, and then removing this etch resistant layer from regions where etching of the substrate is desired. The insulating material is typically deposited by sputtering an oxide of semiconductor material on the integrated circuit structure, while the insulating material is simultaneously removed by back sputtering.

BRIEF DESCRIPTION OF THE DRAWINGS

FIGS. 3–9 illustrate one embodiment of the process of this invention in which FIG. 3 is a cross-sectional view of a semiconductor substrate and overlying layer.

FIG. 4 is a subsequent cross section after anisotropic etching to create an annular groove in the substrate.

FIG. 5 is a subsequent cross-sectional view after oxidation of the substrate.

FIGS. 6–8 are progressive cross-sectional views during combined deposition and removal of additional insulating material, with:

FIG. 6 showing the appearance of the structure after deposition of insulating material begins;

FIG. 7 showing the appearance of the structure after the groove has been completely filled with insulating material; and FIG. 8 showing the appearance of the structure at the end of the process step.

FIG. 9 is a cross-sectional view after removal of undesired insulating material and formation of a pn junction.

DESCRIPTION OF THE PREFERRED EMBODIMENTS

Figure 1A:
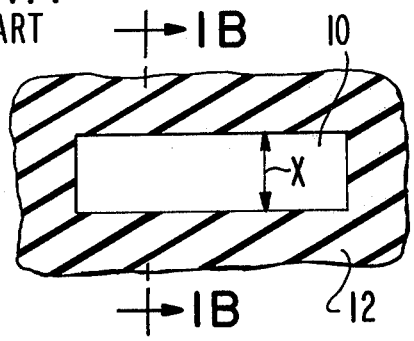
FIG. 1A is a top view of a prior art integrated circuit structure.
Figure 1B:
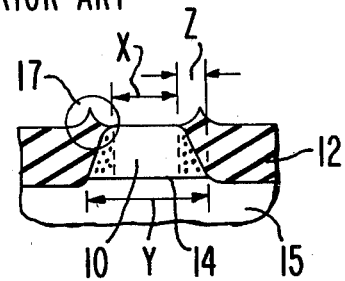
FIG. 1B is a cross-sectional view of the structure shown in FIG. 1A.
Figure 2A:
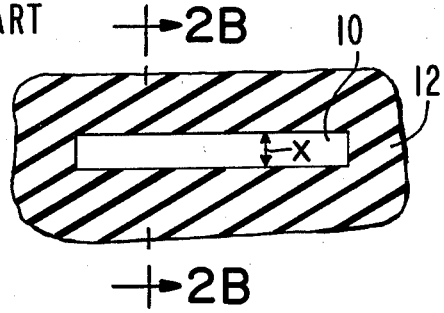
FIG. 2A is a top view of a prior art integrated circuit structure having a smaller electrically isolated region than shown in FIG. 1A.
Figure 2B:
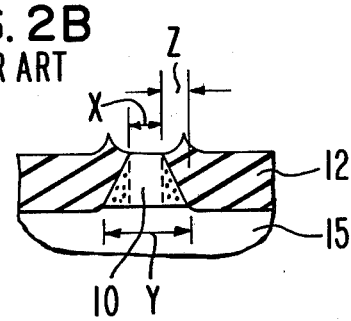
FIG. 2B is a cross-sectional view of the structure shown in FIG. 2A.

FIGS. 1A and 1B provide a top and cross-sectional view, respectively, of an integrated circuit structure using a prior art technique for fabricating oxide isolation. FIGS. 2A and 2B illustrate the limitations of this prior art technique as the dimensions of the region to be electrically isolated are reduced. FIG. 1A is a top view of an integrated circuit structure in which a region of semiconductor material 10, typically silicon, is surrounded by an insulating region 12 of electrically insulating material, typically silicon dioxide. The electrically isolated region shown in FIG. 1A has a width x.

FIG. 1B shows a cross-sectional view of the structure shown in FIG. 1A. As shown, a region of silicon 10 is electrically isolated by being surrounded by silicon dioxide 12 and underlaid by pn junction 14. The pn junction 14 is created by doping silicon 10 to be of opposite conductivity type from silicon 15. The amount of encroachment of oxide 12 into silicon 10 is designated z in FIGS. 2A and 2B. As shown in FIG. 1B, because of the encroachment z, a width y of silicon 10 at pn junction 14 is necessary to obtain a smaller width x of silicon 10 at the surface of the structure. Width y corresponds approximately to the width of the photolithographic mask used to define the oxide isolation. In integrated circuit structures utilizing, for example, five micron design rules, width y would be 5 microns, width z would be approximately 1 micron, and therefore width x would be about three microns. Thus, as a result of encroachment, integrated circuit structures using this structure and five micron design rules are only 60% (3/5) efficient in using the width of silicon 10.

As the technology of fabrication equipment and integrated circuit manufacturing processes has improved, however, the situation described in conjunction with FIGS. 1A and 1B has become more undesirable. This is illustrated by FIGS. 2A and 2B. In FIG. 2A a prior art structure is depicted in which 3 micron design rules have been used. As depicted in FIG. 2B, the reduced dimension y also reduces dimension x. Because of encroachment z, however, the overall design is now only approximately 33% (⅓) efficient. Thus, a larger and larger fraction of the integrated circuit structure itself is consumed by the undesired encroachment z of silicon dioxide 12 into silicon 10 and less and less of the structure may be used for fabrication of active/passive components.

In addition, as shown in FIGS. 1B and 2B, a further undesired result of the technique by which silicon dioxide 12 is formed is the upward protrusion of oxide 12 shown generally within circle 17. The upward protrusion of oxide 12 makes fabrication of overlying layers of material difficult. Such overlying layers tend to crack when traversing contoured surfaces such as presented by the bird's beak 17.

Figure 3:
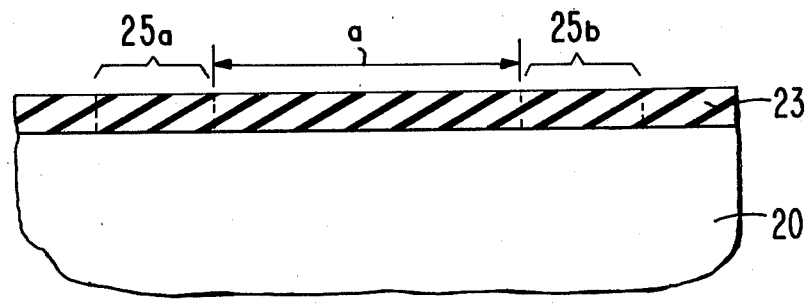

The preferred embodiment of the process of this invention for fabricating integrated circuit structures with oxidized isolation and without encroachment is shown in FIGS. 3–9. As shown in FIG. 3, a semiconductor substrate 20, typically monocrystalline silicon, has formed on its substantially planar upper surface a layer of silicon dioxide 23. Substrate 20 is typically monocrystalline silicon having resistivity of about 10 ohm-centimeters. P conductivity type substrates are typically used for bipolar integrated circuits; however, the conductivity type, impurity concentration and resistivity of the substrate 20 may be selected depending upon the intended use of the integrated circuit to be manufactured therein. The term "substrate" as used herein is intended to refer to the material, of whatever type, in which the oxide isolation is to be formed. For example, in some embodiments of the invention the "substrate" will be epitaxial silicon formed on an underlying material.

In the preferred embodiment, silicon dioxide layer 23 is 5,000 angstroms thick. Layer 23 may be vapor deposited, using well known technology, or may be thermally "grown" by reacting oxygen with substrate 20 at 1,000° C. for approximately 2 hours.

Using known photolithographic or other integrated circuit manufacturing techniques a portion of silicon dioxide layer 23 may be masked and removed, for example, by etching with a 10:1 dilute hydrofluoric acid solution. The portion of layer 23 being removed is designated 25a and 25b in FIG. 3. Regions 25a and 25b are cross-sections taken from a single annular groove which surrounds an intervening region of the substrate 20. This intervening region has width "a" as shown in FIG. 3. Active and/or passive electronic components may be subsequently formed in the intervening region of the substrate 20. These components will be electrically isolated from surrounding regions of the substrate as will be shown in FIG. 8.

In other embodiment of the invention, oxide 23 is not used to define the intervening region of the substrate 20. In such an embodiment, photoresist, or other known masking material, may be deposited directly on the surface of substrate 20 and patterned using well known photolithographic techniques. In this manner regions 25a and 25b will be defined in the photoresist.

Figure 4:
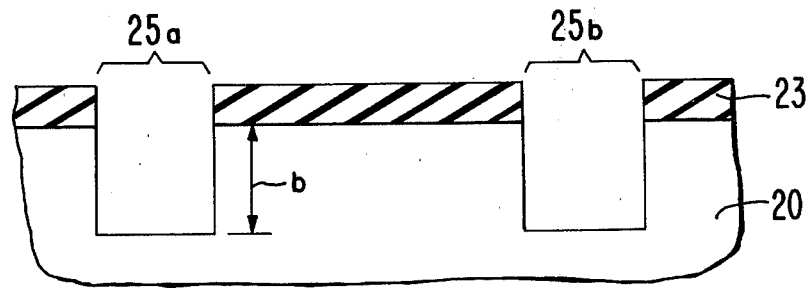

As next shown in FIG. 4, substrate 20 is anisotropically etched to a desired depth b. In the preferred embodiment, this is accomplished using known plasma etching techology with silicon dioxide layer 23 serving as a mask to prevent etching of substrate 20 except where the oxide 23 has been removed. In the preferred embodiment of this invention, the etching of regions 25a and 25b is carried out anisotropically to prevent undercutting beneath silicon dioxide layer 23. For example, silicon 20 may be etched using freon gas or using chlorotrifluoromethane ($CClF_3$). In a typical embodiment, plasma, at a pressure of 200–300 microtorr, is used. The power setting of the plasma etch apparatus may be adjusted depending upon the desired speed of material removal. The Plasma Yield 335 plasma etcher manufactured by D and W Industries, Sunnyvale, Calif. has been used by the assignee of this invention to perform this step.

Figure 4A:
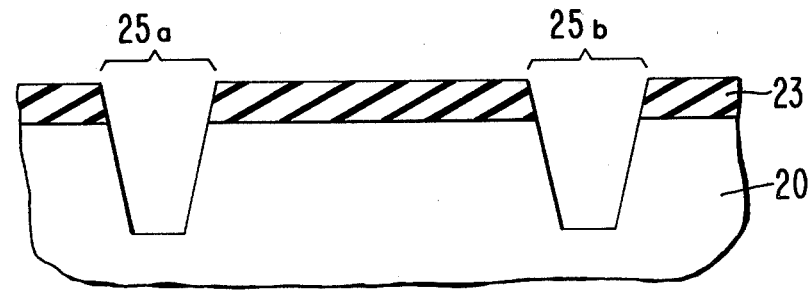
FIG. 4A is a alternative subsequent cross-section after anistropic etching with a plasma containing chlorine.

In another embodiment chlorine ($Cl_2$) may be added to the plasma used to etch substrate 20 where regions 25a and 25b were defined. The chlorine will cause the openings to have sloped sides as shown in FIG. 4A. Such sloped sides can be advantageous in fabricating certain types of integrated circuit structures. Depending upon the particular integrated circuit structure to be manufactured in substrate 20, depth b usually will be between 0.5 and 2 microns.

In yet another embodiment, anisotropic etching can be accomplished chemically with an etching fluid of potassium hydroxide (KOH) and water if <100> or <123> monocrystalline silicon is used as substrate 20.

Figure 5:
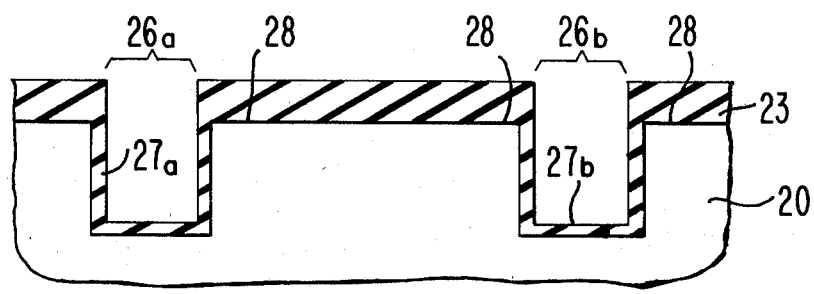

As shown in FIG. 5, in the preferred embodiment of the process of this invention, an additional layer of silicon dioxide 27 is then formed on the interior surface of the annular groove 26 in the substrate 20. Because the structure is shown in cross-section in FIG. 5, the two cross-sections of the annular groove are designated 26a and 26b, and the oxide layer 27a and 27b. In the preferred embodiment, silicon dioxide 27 is approximately 1,000 angstroms thick and fabricated by heating substrate 20 to approximately 1,000° C. for one-half hour. Silicon dioxide layer 27 prevents subsequent process operations from damaging the interface 28 between silicon dioxide 23 and silicon 20 where interface 28 intersects opening 26. The precise location of interface 28 will change depending upon the thermal processing to which substrate 20 is subjected. For example, if the substrate is subsequently sufficiently heated, more of silicon 20 will be oxidized to silicon dioxide thereby lowering the interface 28. In the preferred embodiment, the thickness of silicon dioxide layer 27 must be thick enough to prevent damage to interface 28 but not so thick as to consume an undesirably large amount of the silicon from the interior surfaces of opening 26 in substrate 20. Depending upon the particular equipment used for the process steps depicted in FIGS. 6-8, however, the thickness of layer 27 may be changed from the preferred 1000 angstroms.

Figure 6:
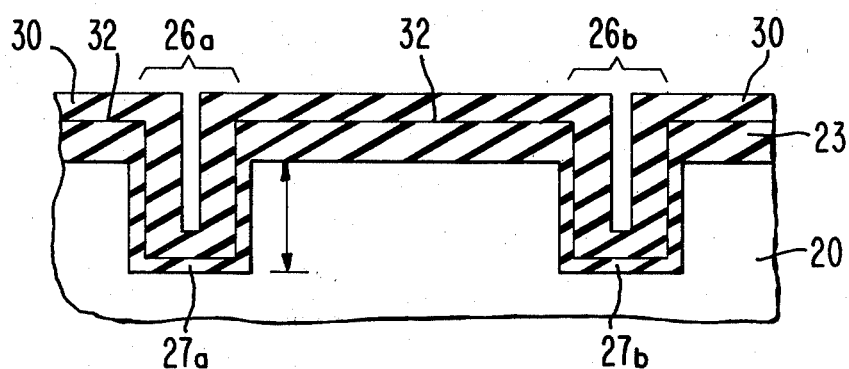

As next shown in FIG. 6, deposition of a layer of silicon dioxide 30 across the upper surface of layer 23 and in the openings 26a and 26b is begun. For clarity of explanation, and only in FIG. 6, the newly deposited silicon dioxide 30 is depicted as having an interface 32 with underlying silicon dioxide layer 23. Because both layers 23 and 30 are silicon dioxide, however, a clearly defined interface such as depicted will not occur. Silicon dioxide 30 may be deposited using well known rf-diode sputtering equipment. In the preferred embodiment, a parallel plate Model 2400 BL sputtering machine manufactured by Perkin-Elmer is used. The process is carried out in Argon gas at 10 microtorr pressure using 1 kw rf power, 1,400 volts target bias and zero volts substrate bias.

Figure 7:
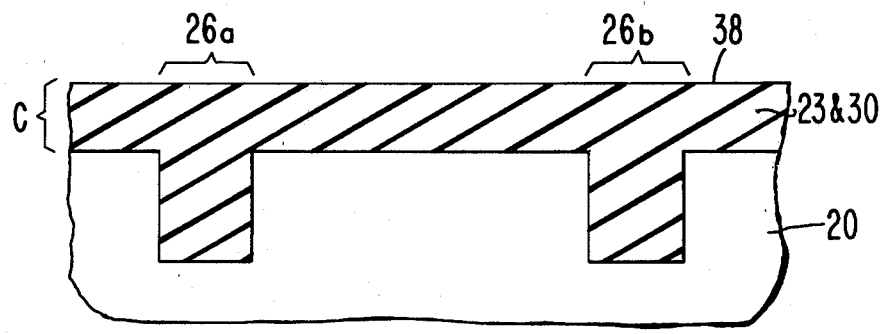
Figure 8:
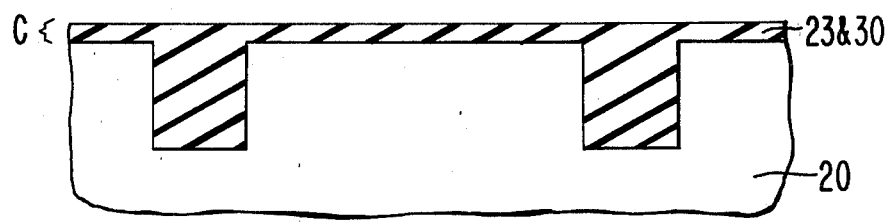

FIG. 6 depicts the appearance of the integrated circuit structure in cross section at an intermediate time during the process. Because, as will be explained below, the process steps depicted in FIGS. 6, 7 and 8 are carried out in a continuous manner, FIG. 6 represents the appearance of the structure near the beginning of the process; FIG. 7 the appearance of the structure at a subsequent time; and FIG. 8 at the completion of the process step.

Using the apparatus mentioned above, the silicon dioxide layer 30 is allowed to fill openings 26a and 26b to about ⅛ to ¼ of their overall depth b. As the deposition process proceeds, however, the RF bias applied to the integrated circuit substrate 20 in the Perkin-Elmer apparatus is increased, for example, to 300–400 volts. This operation is termed back sputtering herein. In this manner, the silicon dioxide 30 is simultaneously deposited on generally vertical surfaces, for example, the sides of the openings, while being removed from the generally horizontal surfaces, for example, the bottoms of the openings and the upper surface of the structure. The simultaneous deposition and removal cause most of the silicon dioxide 30 to be deposited in the opening 26 and less on the surface of substrate elsewhere.

The sputtering and simultaneous removal are continued with the substrate 20 biased in this manner until a substantially planar surface 38 is achieved as depicted in FIG. 7. In the preferred embodiment oxide 23 and 30, where it overlies substrate 20 outside region 26 will be approximately 2000 angstroms thick. The important result, however, is that oxide 30 will have a substantially planar upper surface even over opening 26 in substrate 20.

Sputtering operations similar to that described in conjunction with FIGS. 6 and 7 are discussed in "Metal Edge Coverage and Control of Charge Accumulation in RF Sputtered Insulators," by J. S. Logan, F. S. Maddocks and P. D. Davidse, *IBM J. Res. Develop.*, pp. 182–191, March 1979; "Sputtered Insulator Film Contouring Over Substrate Topography," by T. N. Kennedy, *J. Vac. Sci. Technol.*, vol. 13, No. 6, pp. 1135–1137, November/December 1976; and "Planar Metal Interconnections by Backfilled Quartz," by J. S. Logan, J. L. Mauer and L. B. Zielinski, *IBM Technical Disclosure Bulletin*, vol. 21, No. 12, pp. 4865–4866, May 1979.

Another technique which may also be used to create the planar surface is sputter deposition and removal using ion guns. One ion gun is directed toward a target while the other gun, operating at a lower power level is directed toward the substrate. This technique can give similar results to rf diode sputtering with and without substrate bias.

In the preferred embodiment, once the desired planar surface 38 is achieved, the target bias is reduced to zero and the substrate bias held at its previous level (300–400 volts) or increased. The changed relative potentials between the substrate 20 and the target cause the substrate 20 to act as a source of silicon dioxide 23 and 30, and the thickness c will be gradually reduced. In the preferred embodiment the silicon dioxide 23 and 30 is removed from the structure until thickness c is approximately 500 angstroms. At this time, in the preferred embodiment, the process is stopped and the structure removed from the sputtering machine.

Figure 9:
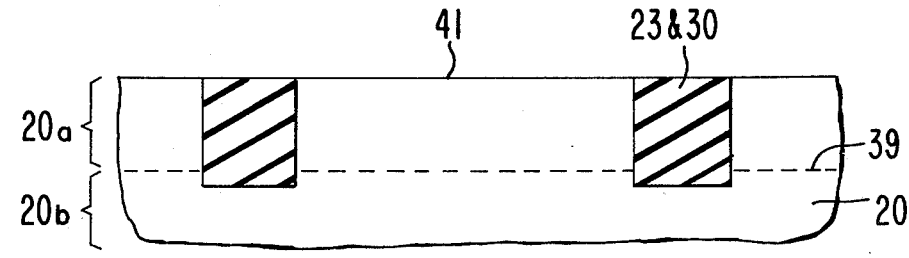

If desired, the remaining 500 angstrom layer of silicon dioxide 23 and 30 may be removed by dip etching the structure in hydrofluoric acid In this manner a very smooth upper surface 41 is achieved as shown in FIG. 9.

The structure of FIG. 9 also may be achieved from the structure shown in FIG. 8 by planar plasma etching. In this embodiment, a Sigma 80 planar plasma etcher manufactured by Branson IPC of Hayward, Calif., is used to plasma etch through silicon dioxide 23 and 30 until the upper surface 41 of substrate 20 is exposed. This may be accomplished, for example, by using a mixture of halocarbon and inert gases. Such apparatus can detect the completion of the etching process by the reaction products produced by the substrate 20 and will stop the etching upon detection of these reaction products.

Additional well known process operations may be performed on the structure shown in FIG. 9 to fabricate the desired integrated circuit structure. For example, a pn junction 39 may be created in substrate 20 to electrically isolate electronic components formed in silicon 20a from underlying silicon 20b. The pn junction 39 may be formed in any well known manner, for example, by introduction of impurities into substrate 20 using ion implantation, or by fabrication of buried and epitaxial layers such as shown in FIGS. 10a and 10b the Peltzer patent discussed above. The structure depicted in FIG. 9 may be used to fabricate bipolar integrated circuits in the manner taught by Peltzer. Alternatively, integrated injection logic devices may be formed, for example, as taught in U.S. Pat. Nos. 3,962,717 or 3,993,513, or MOS and CMOS circuits may be created using known technology. Of course the process operations used to fabricate integrated circuits in substrate 20 may be carried out at desired times preceding, during, or following the process described above. For example, the pn junction 39 may be created prior to the process depicted in FIG. 3 or at other times.

The structure depicted in FIG. 9 provides two primary advantages over the prior art oxide isolated integrated circuit structure shown in FIGS. 1 and 2. The structure shown in FIG. 9 provides oxide isolation 23 and 30 which does not encroach into the semiconductor material 20 adjacent the oxide isolation. This is a result of the vertical walls of regions 26a and 26b. Secondly, the upper surface 41 of the structure fabricated according to this invention is planar. There are no regions of oxide isolation which protrude above the surface of the silicon to make difficult the subsequent fabrication of layers on the surface of substrate 20 or silicon dioxide 30. Because the oxide isolation 23 and 30 does not encroach into silicon 20 as with prior art structures, there is no parasitic silicon to store charge when the bias of the silicon 20a is changed with respect to silicon 20b. This allows active electronic components fabricated in silicon region 20a to operate faster and/or at lower power. Further, the absence of encroachment makes fabrication of sub-micron sized regions feasible.

Although the invention has been described with reference to a preferred embodiment, the description is intended to be illustrative of the invention and not to be construed as limiting the invention. Various modifications and applications will occur to those skilled in the art without departing from the spirit and scope of the invention as defined by the appended claims.

What is claimed is:

1. A method for fabricating an insulating region in conjunction with an integrated circuit structure having a substrate, the method comprising:
   removing a first portion of the substrate to create an opening wherein the insulating region is to be formed;
   beginning to deposit insulating material across the substrate and in the opening;
   continuing to deposit insulating material while simultaneously removing insulating material from generally horizontal surfaces and redepositing it on generally vertical surfaces to create a substantially planar layer of insulating material across the substrate and over the opening; and
   ceasing to deposit insulating material when the substantially planar layer is a desired thickness.

2. A method as in claim 1 wherein the steps of beginning to deposit and continuing to deposit insulating material comprise sputtering the insulating material onto the integrated circuit structure.

3. A method as in claim 2 wherein immediately prior to the step of sputtering the insulating material the opening in the substrate is oxidized.

4. A method as in claim 1 wherein the step of continuing to deposit comprises back sputtering the insulating material.

5. A method as in claim 4 wherein the substrate is silicon.

6. A method as in claim 5 wherein the insulating material is silicon dioxide.

7. A method as in the claim 1 wherein the step of removing a first portion of the substrate comprises anisotropically etching the substrate.

8. A method as in claim 7 wherein the anisotropic etching comprises etching with a plasma.

9. A method as in claim 8 wherein the step of etching with a plasma comprises:
   depositing a first material resistant to the plasma on the surface of the substrate;
   fabricating an opening in the first material wherever the first portion of the substrate is to be removed; and
   removing the first portion of the substrate by plasma etching through the opening made in the preceding step.

10. A method for fabricating insulating regions in an integrated circuit structure having a substrate, the method comprising:
    forming a layer of masking material over all of a surface of the substrate except where the insulating regions are to be formed;
    removing a portion of the substrate from wherever the substrate is not overlaid by the layer of masking material to thereby create openings in the substrate;
    oxidizing the substrate and the openings to create a layer of oxidized material on the surface of the substrate and in the openings; and
    depositing insulating material on the substrate and in the openings while simultaneously removing insulating material from generally horizontal surfaces and redepositing it on generally vertical surfaces to create a substantially planar surface of insulating material over the substrate and the openings.

11. A method as in claim 10 further comprising the step of removing insulating material from the substantially planar surface until a desired thickness is achieved.

12. A method as in claim 10 wherein the insulating material is removed from the surface of the substrate until the surface of the substrate is exposed.

13. A method as in claim 12 wherein the insulating material is silicon dioxide.

14. A method as in claim 13 wherein the substrate is silicon.